(12) United States Patent
Aiba et al.

(10) Patent No.: US 6,909,181 B2
(45) Date of Patent: Jun. 21, 2005

(54) LIGHT SIGNAL PROCESSING SYSTEM

(75) Inventors: Yoshitaka Aiba, Kawasaki (JP);
Hirohisa Matsuki, Kawasaki (JP);
Mitsutaka Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/097,815

(22) Filed: Mar. 15, 2002

(65) Prior Publication Data

US 2003/0094700 A1 May 22, 2003

(30) Foreign Application Priority Data

Nov. 16, 2001 (JP) ........................................ 2001-351501

(51) Int. Cl.[7] ........................ H01L 23/48; H01L 23/52; H01L 29/40
(52) U.S. Cl. ........................................ 257/737; 257/781
(58) Field of Search ................................ 257/693, 697, 257/737, 738, 778–781

(56) References Cited

U.S. PATENT DOCUMENTS

| | | | | |
|---|---|---|---|---|
| 5,633,204 A | * | 5/1997 | Tago et al. | 438/614 |
| 6,255,206 B1 | * | 7/2001 | Jang et al. | 438/595 |
| 6,413,851 B1 | * | 7/2002 | Chow et al. | 438/613 |
| 6,420,255 B1 | * | 7/2002 | Takahashi | 438/613 |
| 6,461,894 B2 | * | 10/2002 | Brand | 438/106 |
| 6,590,287 B2 | * | 7/2003 | Ohuchi | 257/738 |
| 2002/0132463 A1 | * | 9/2002 | Urushima | 438/613 |
| 2003/0001283 A1 | * | 1/2003 | Kumamoto | 257/778 |
| 2003/0096495 A1 | * | 5/2003 | Ihara et al. | 438/614 |

OTHER PUBLICATIONS

DM4030LD Product Data Sheet from diemat.com.*

* cited by examiner

*Primary Examiner*—David A. Zarneke
(74) *Attorney, Agent, or Firm*—Westerman, Hattori, Daniels & Adrian, LLP

(57) ABSTRACT

There are provided a sealing insulating film that is formed on a substrate and melted at a first heating temperature to have a flowability, and external terminals that are formed on the substrate, and connected to other electronic device at a second heating temperature higher than the first heating temperature, and surrounded by the sealing insulating film.

15 Claims, 18 Drawing Sheets

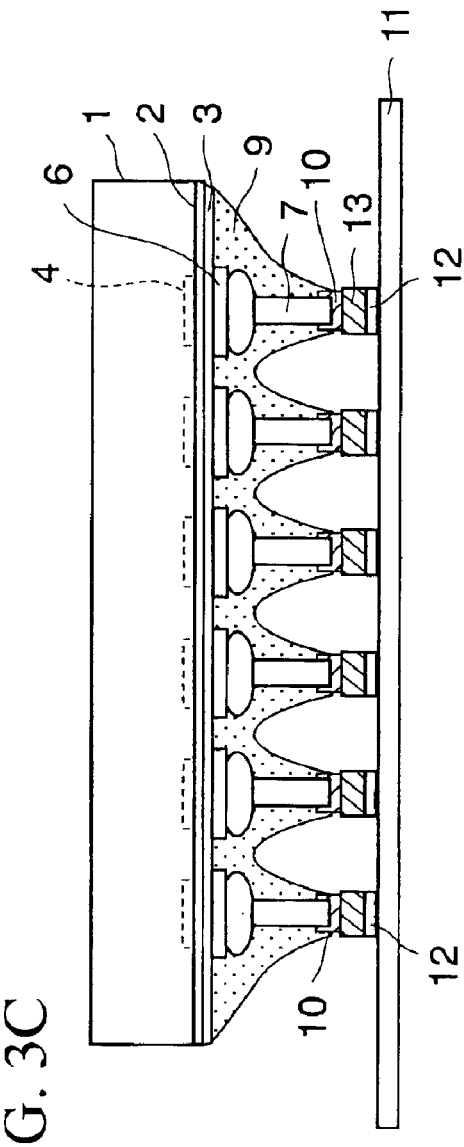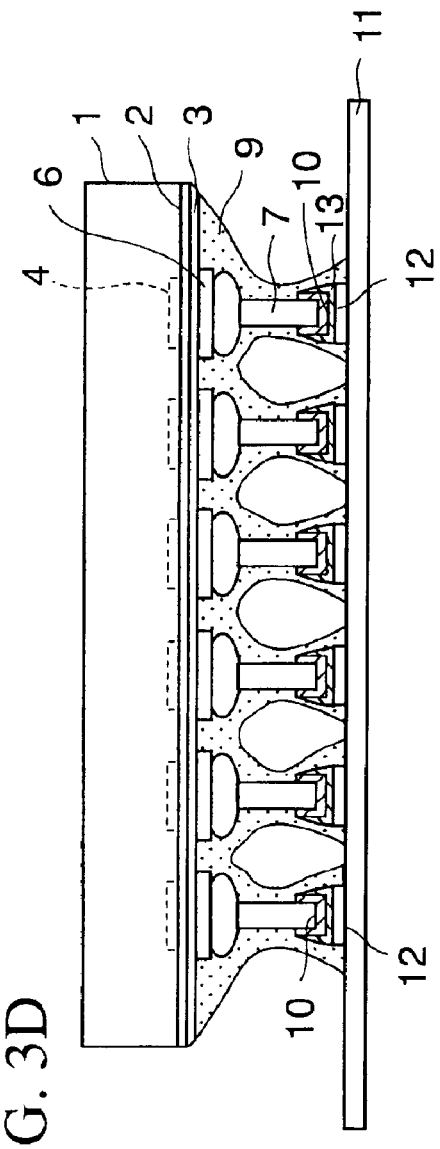

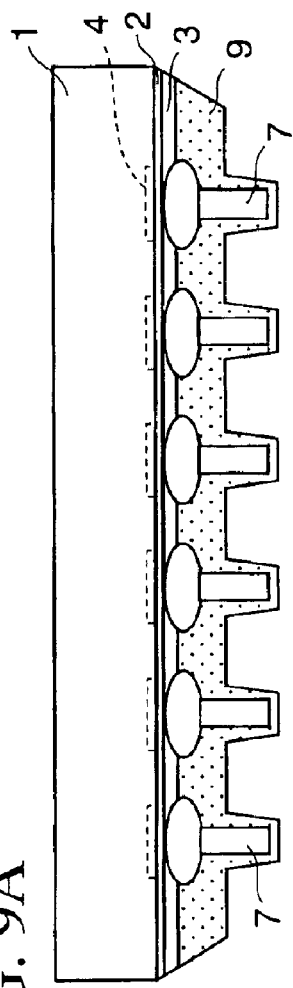
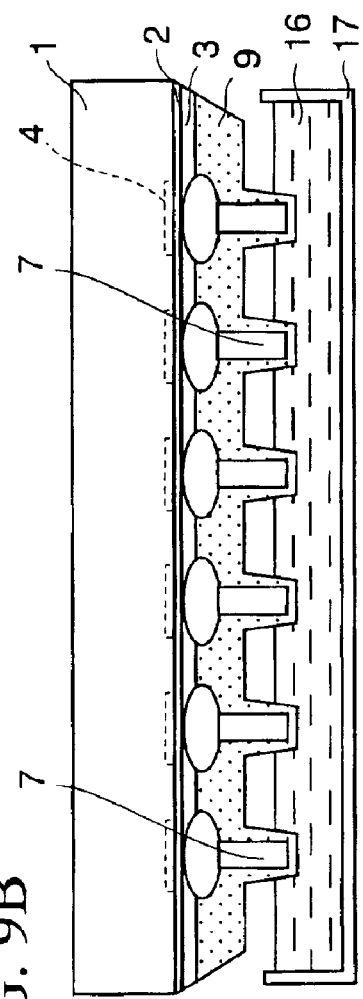

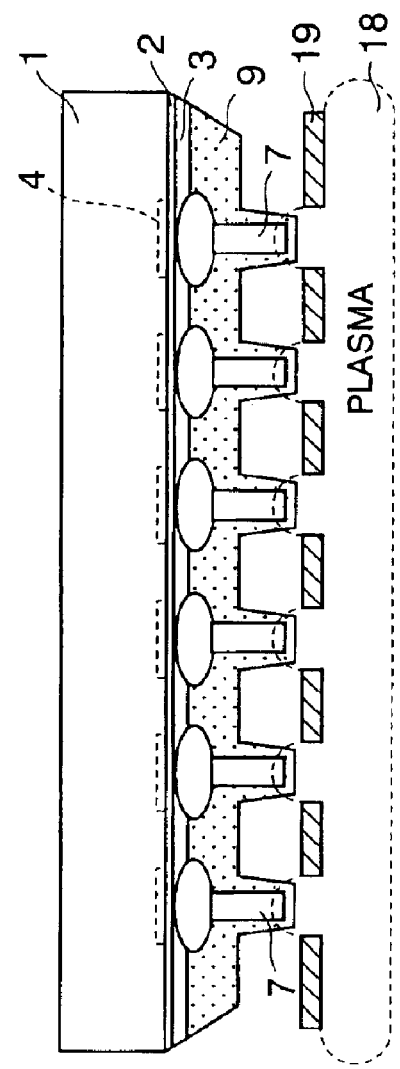
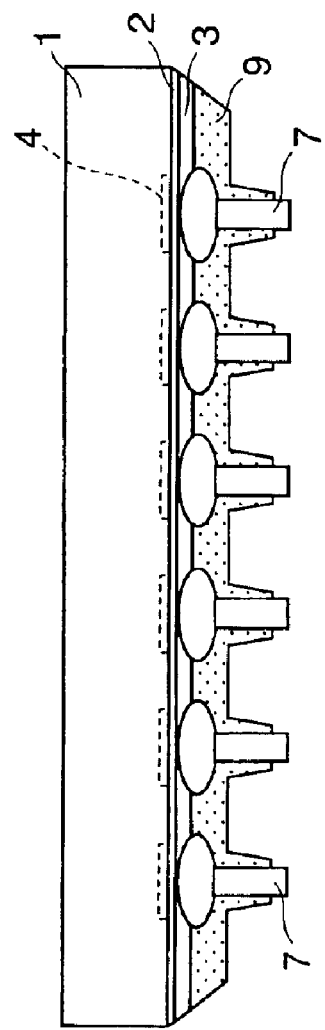
FIG. 10A
FIG. 10B

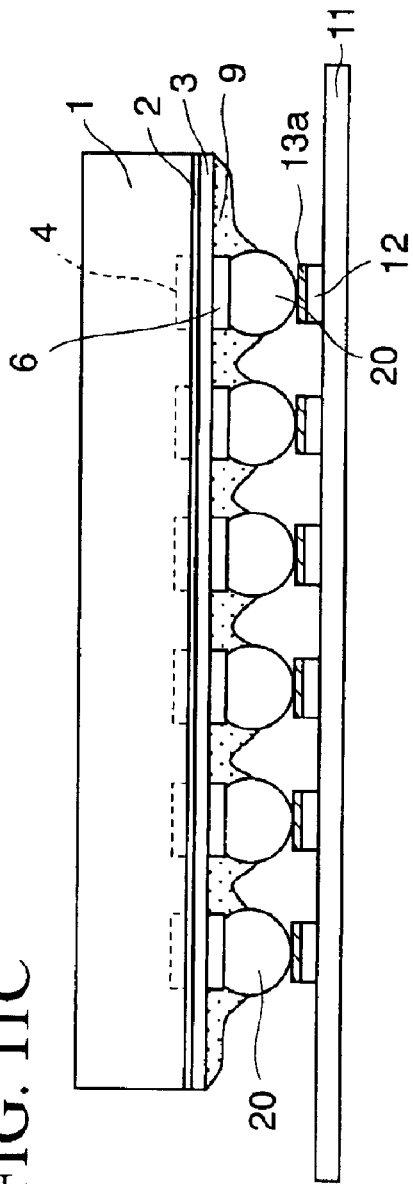
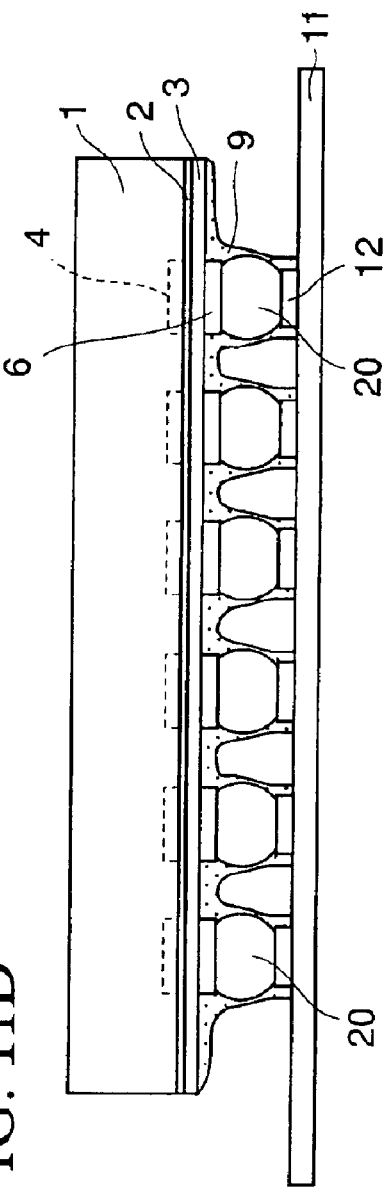

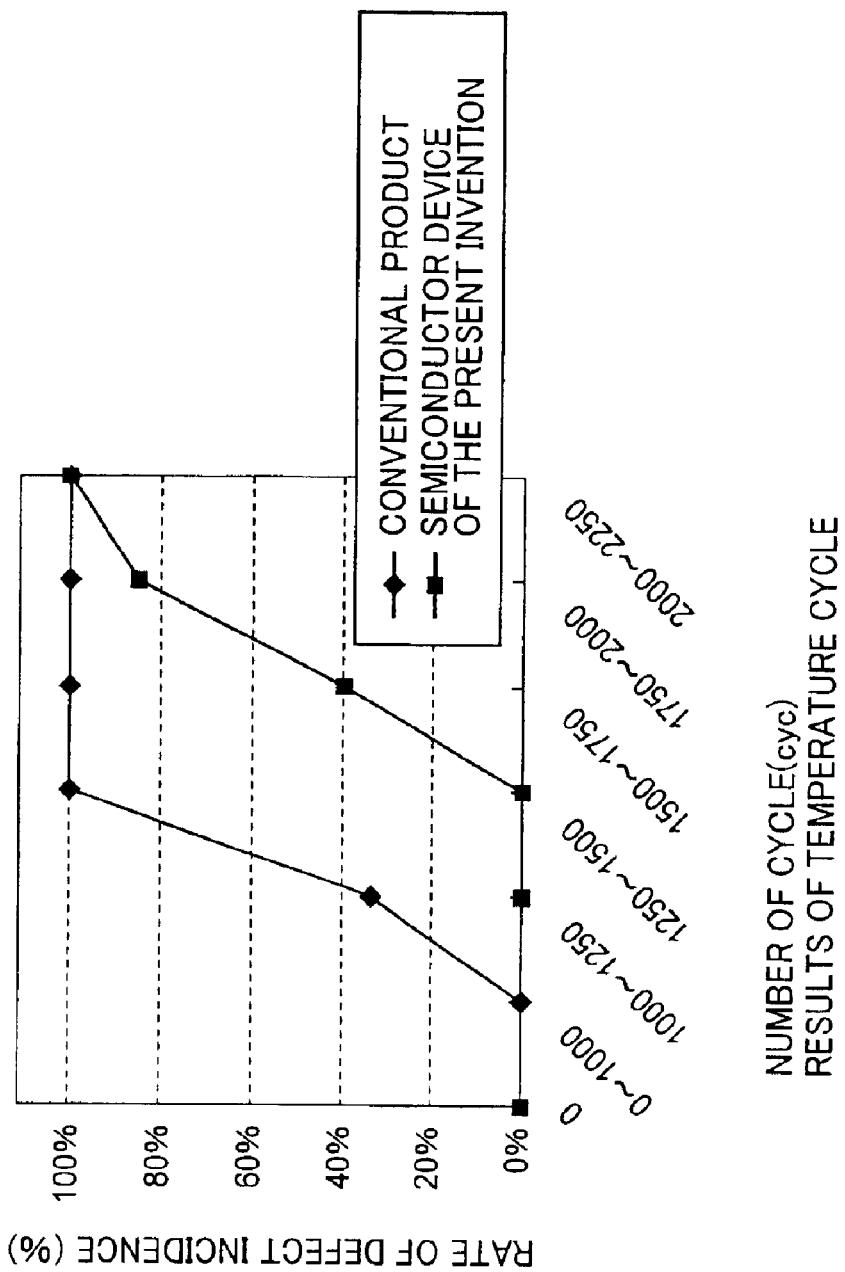

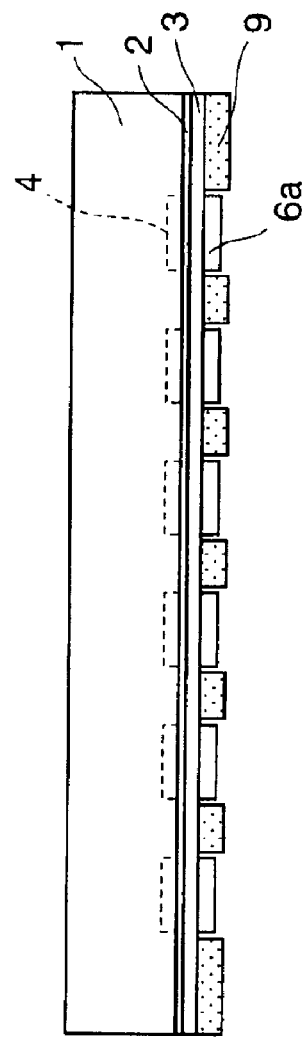
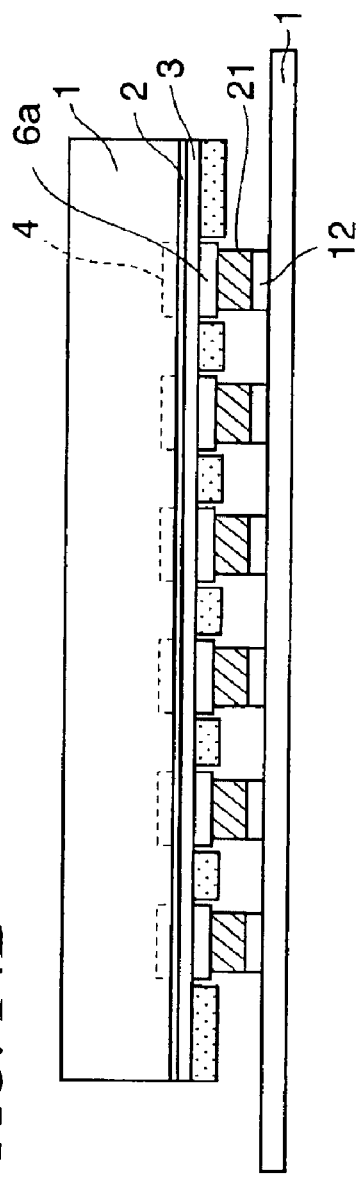
FIG. 14A
FIG. 14B

LIGHT SIGNAL PROCESSING SYSTEM

CROSS-REFERENCE TO RELATED APPLICATIONS

This application is based upon and claims priority of Japanese Patent Application No. 2001-351501, filed in Nov. 16, 2001, the contents being incorporated herein by reference.

BACKGROUND OF THE INVENTION

1. Field of the Invention

The present invention relates to an electronic device, an electronic device sealing method and an electronic device connecting method and, more particularly, an electronic device such as a semiconductor device, a wiring substrate, etc. that have external terminals, an electronic device sealing method and an electronic device connecting method.

2. Description of the Prior Art

With the progress of the miniaturization, the high function, and the high integration of the semiconductor device, the number of input/output terminals tends to increase. Also, in the semiconductor device, there is the request to reduce a size of the package that covers the semiconductor device chip. Under such circumstance, the technology of the semiconductor package that is suitable for the high-density packaging of the semiconductor device is being developed.

In the semiconductor device, the structure for packaging the external terminals on one surface is developed with regard to the alignment margin of the external terminals and the reduction of the packaging burden. There are various types such as BGA (Ball Grid Array), LGA (Land Grid Array), PGA (Pin Grid Array), etc.

The external terminals of such semiconductor device are connected to the wiring or the terminals on the substrate via the solder.

For example, as shown in FIG. 1A, a semiconductor device 103 having uppermost wiring patterns 102, to which a solder 101 is jointed, as the external terminals and a mother board 105 having terminals 104 on its uppermost surface are prepared. Then, the solders 101 on the semiconductor device 103 are superposed on the terminals 104 on the mother board 105. Then, as shown in FIG. 1B, the terminals 104 and the wiring patterns 102 are jointed by heating/melting the solders 101. Accordingly, the semiconductor device 103 and the mother board 105 are electrically and mechanically connected.

By the way, as shown in FIG. 1B, if the semiconductor device 103 and the mother board 105 are connected via the solders 101, the solders 101 are brought into the state that they are exposed to the outside. Therefore, depending upon to the material of the solder or the material of the external terminals, there is the fear that the solders 101 are reacted with the gas in the outside air and then are degraded.

Also, if the size of the semiconductor circuit device is reduced up to the chip size, the capability of relaxing the thermal stress becomes low rather than the prior art and thus the stress tends to concentrate to the packaging portion of the external terminals. As a result, there is the fear that the cohesion destruction is generated in the jointed portions of the external terminals to which the stress is concentrated. Also, if the external terminals are the pin-type one, there is the possibility that the external terminals are deformed or folded due to the stress concentration.

SUMMARY OF THE INVENTION

It is an object of the present invention to provide an electronic device capable of preventing the degradation of jointed terminals or jointed wiring and terminal, an electronic device sealing method and an electronic device connecting method.

The above subject can be overcome by providing an electronic device which comprises a sealing insulating film that is formed on a substrate and melted at a first heating temperature to have a flowability, and external terminals that are formed on the substrate, and connected to other electronic device at a second heating temperature higher than the first heating temperature, and surrounded by the sealing insulating film.

According to the present invention, the sealing insulating film that is melted at the first heating temperature and has the flowability is formed around the external terminals formed like a pin, a ball, or a flat surface, and then the external terminals are connected to other electronic device at the second heating temperature that is higher than the first heating temperature.

Therefore, when the external terminals are connected to other electronic device, the sealing insulating film (resin film) flows out due to its own weight and covers the external terminals. Then, after the connection of the external terminals is finished and the electronic device is cooled, the sealing insulating film is hardened and thus the mechanical strength of the external terminals can be reinforced by the sealing insulating film. As a result, the stress being applied from the outside to the external terminals can be relaxed to prevent the deformation, and also the reaction with the outer gas can be shielded by the sealing insulating film and thus the degradation of the external terminals can be prevented.

BRIEF DESCRIPTION OF THE DRAWINGS

FIGS. 3A to 3D are sectional views showing steps of connecting the semiconductor device according to a first embodiment of the present invention to a mother board;

FIGS. 9A to 9D are sectional views showing a first example of a method of exposing top ends of pin-like terminals of a semiconductor device according to a third embodiment of the present invention from a sealing resin;

FIGS. 10A and 10B are sectional views showing a second example of a method of exposing the top ends of the pin-like external terminals of the semiconductor device according to the third embodiment of the present invention from the sealing resin;

FIGS. 11A to 11D are sectional views showing steps of connecting a semiconductor device according to a fourth embodiment of the present invention to the mother board;

FIG. 13 is a view showing results of the temperature cycle test on the semiconductor device according to the fourth embodiment of the present invention and the semiconductor device in the prior art; and FIGS. 14A to 14D are sectional views showing steps connecting a semiconductor device according to a fifth embodiment of the present invention to the mother board.

DETAILED DESCRIPTION OF THE PREFERRED EMBODIMENTS

Embodiments of the present invention will be explained with reference to the accompanying drawings hereinafter.

(First Embodiment)

Figure 1A:
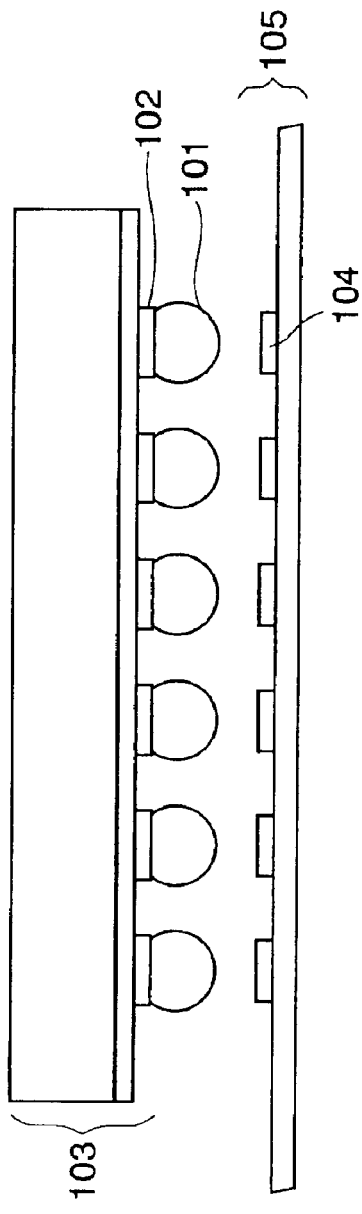
FIGS. 1A and 1B are sectional views showing the jointing steps of the semiconductor device in the prior art.
Figure 1B:
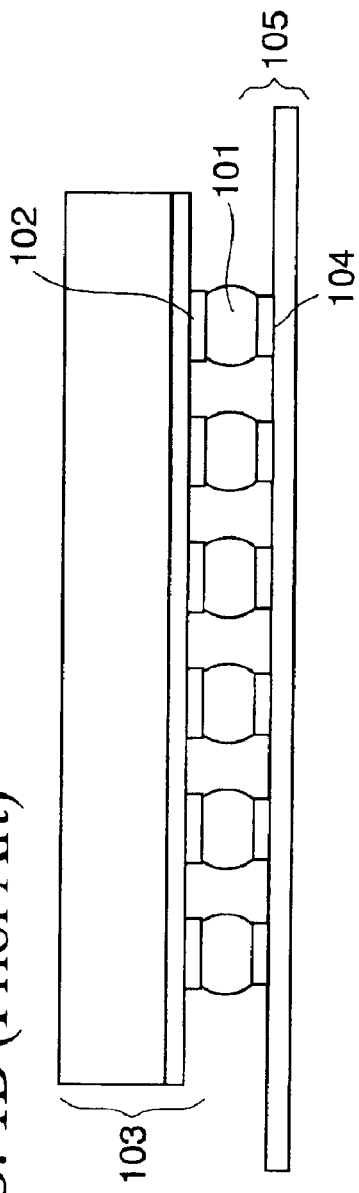
Figure 2A:
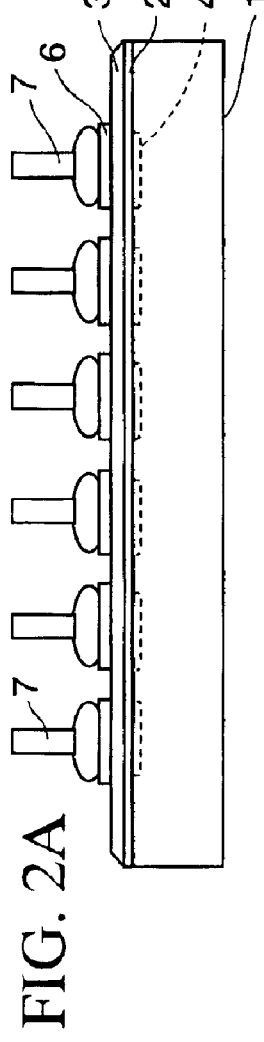
FIGS. 2A to 2C are sectional views showing steps of forming a sealing resin of a semiconductor device according to a first embodiment of the present invention.
Figure 2B:
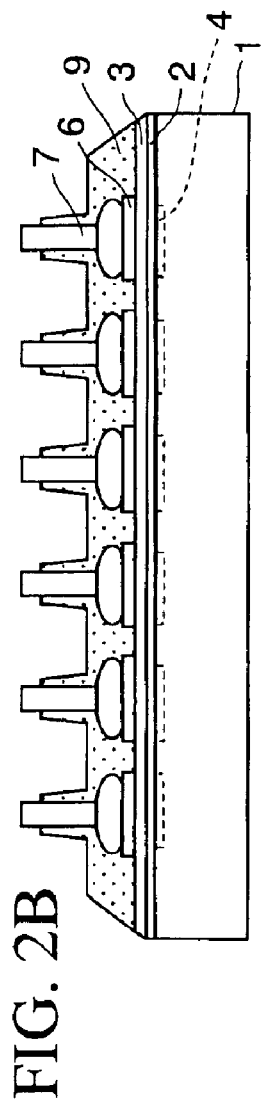
Figure 2C:
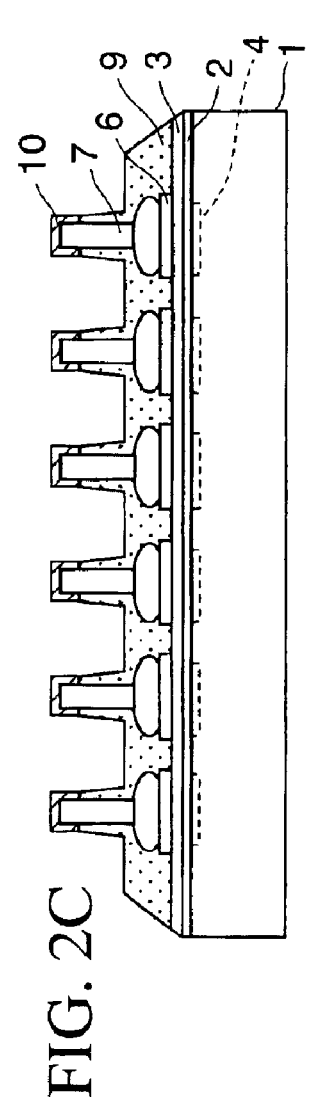

FIGS. 2A to 2C are sectional views showing steps of covering external terminals of a PGA-type semiconductor device according to a first embodiment of the present invention. FIGS. 3A to 3D are sectional views showing steps of jointing the external terminals to terminals on a mother board. Also, FIG. 4 is a plan view showing relocated wirings of the semiconductor device.

First, as shown in FIG. 2A, a semiconductor circuit device (substrate) 1 that is formed on a semiconductor substrate such as silicon is prepared. An inorganic insulating film 2 made of $SiO_2$ and an underlying cover film 3 made of the organic material such as polyimide, benzocyclobutene, etc. are formed in sequence on one surface of the semiconductor circuit device 1.

Figure 4:
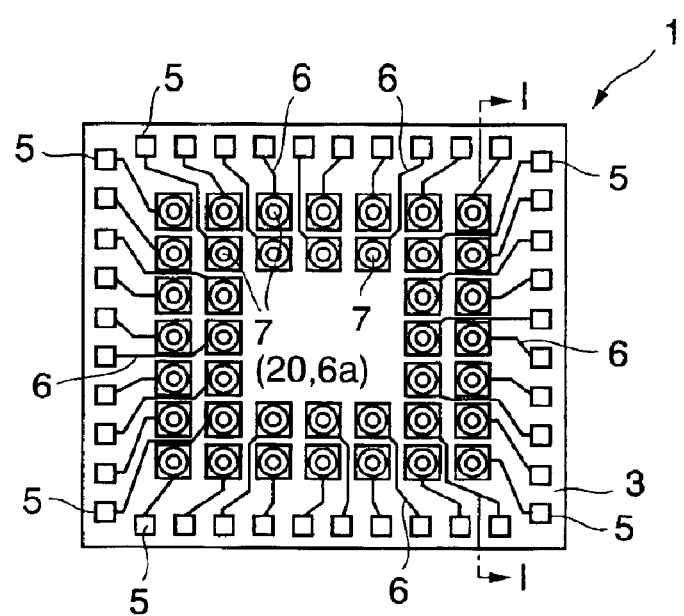
FIG. 4 is a plan view showing a state obtained before the sealing resin of the semiconductor device according to the first embodiment of the present invention is formed.

Openings 5 for exposing conductive pads (terminals) 4, that are formed on one surface side of the semiconductor circuit device 1, are formed on the inorganic insulating film 2 and the underlying cover film 3, as shown in FIG. 4. Also, relocated wiring patterns 6 made of the metal such as gold, copper, etc. are formed on the underlying cover film 3 to extend from the conductive pads 4 to the center area. Pin-like external terminals 7 made of gold, copper, palladium, or the like to have a height of 200 to 250 μm and a diameter of about 50 μm are connected onto the relocated wiring patterns 6.

As the method of forming the pin-like external terminals 7, there are the method of bonding the metal wires onto surfaces of the relocated wiring patterns 6 and then cutting the metal wires in the upright state, the method of connecting metal pins onto the relocated wiring patterns 6 by the solder, etc.

Then, as shown in FIG. 2B, a sealing resin film (insulating layer) 9 is formed on the external terminals 7, the underlying cover film 3 and the relocated wiring patterns 6 other than upper ends of the pin-like external terminals 7. The sealing resin film 9 is spin-coated on the underlying cover film 3 and then solidified by the heat. Such spin coating is adjusted by changing the speed of rotation by four steps or more in coating, for example, such that top ends of the external terminals 7 are exposed.

The sealing resin film 9 is selected from the resin materials to satisfy three conditions, i.e., first the resin is thermoplastic and has the property such that it has the flowability at the temperature in excess of the glass transition temperature to flow by its own weight, second the glass transition temperature of the resin is lower than the melting point of the conductive adhesives (e.g., solder) used to connect the external terminals, and third the resin is solidified to have the sufficient mechanical strength after such resin is cooled below the glass transition temperature.

It is preferable that the viscosity of the sealing resin film 9 should become smaller than 4000 mPa s at the temperature higher than the glass transition temperature or should be less than 2000 Pa s at the temperature lower than the glass transition temperature, for example. The material constituting the sealing resin film 9 has the elastic modules of less than 1 Mpa at the temperature lower than the glass transition temperature, for example.

As such resin material, there are DM4030LD (product name) having the glass transition temperature of about 150° C. and manufactured by Techno Alpha and CRP-X4323 (product name) manufactured by Sumitomo Bakelite Co., Ltd., for example.

Then, as shown in FIG. 2C, a conductive film 10 such as the solder, the conductive past, or the like is formed on surfaces of the top ends of the pin-like external terminals 7 that are exposed from the sealing resin film 9. The conductive film 10 is a part of the pin-like external terminals 7.

As a result, the step of covering the pin-like external terminals 7 and the relocated wiring patterns 6 with the sealing resin film 9 is completed, and the step of covering the top ends of the pin-like external terminals 7 with the conductive film 10 is completed.

Then, the pin-like external terminals 7 of the semiconductor circuit device 1 are connected to terminals 12 of other electronic device, e.g., a mother board 11 in compliance with the steps described in the following.

Figure 3A:
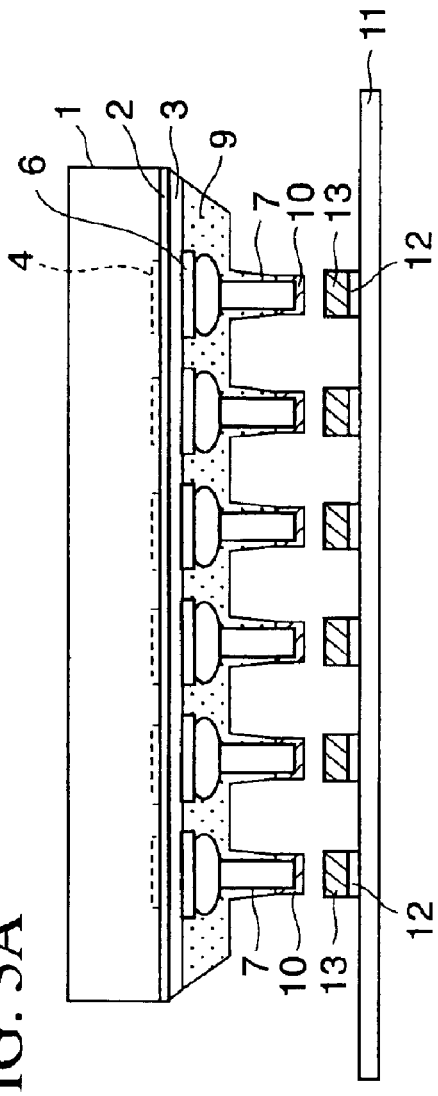

First, as shown in FIG. 3A, the mother board 11 having the terminals 12 to which an adhesive resin film 13 is adhered is prepared. The adhesive resin film 13 is formed of the material having the melting point that is higher than the glass transition temperature but is equal to or lower than the melting point of the conductive film 10, e.g., the conductive material such as the solder paste, the conductive paste, the conductive resin, or the like.

Figure 3B:
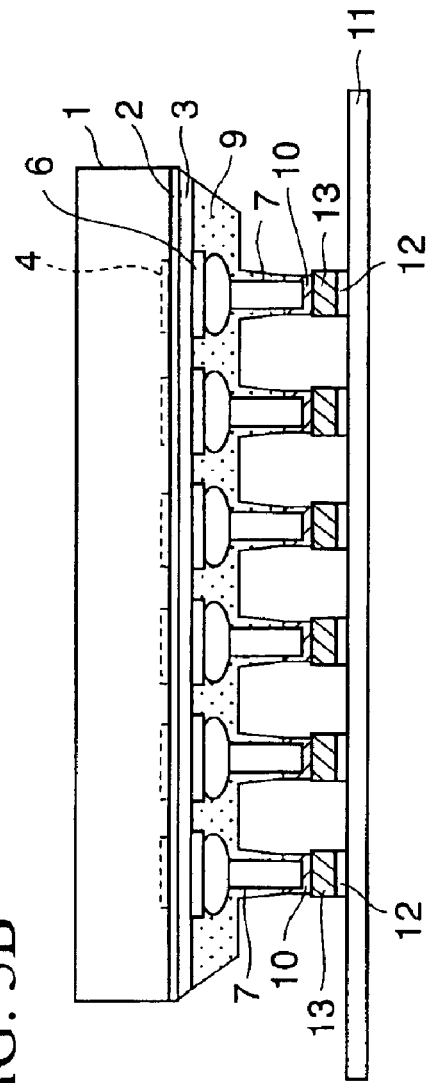

Then, as shown in FIG. 3B, the semiconductor circuit device 1 is superposed on the mother board 11 so as to put the top ends of the pin-like external terminals 7 on the terminals 12. In this state, the semiconductor circuit device 1 and the mother board 11 are put into a heating apparatus (not shown).

Then, the heating of the conductive film 10 and the adhesive resin film 13 is started. The heating temperature is increased gradually from the room temperature to pass the glass transition temperature as the passing point. The sealing resin film 9 exhibits the flowability when it reaches the glass transition temperature, and then flows out to the side surfaces of the conductive film 10, as shown in FIG. 3C.

Then, as shown in FIG. 3D, if the temperature of the conductive film 10 exceeds the melting point by increasing the heating temperature, both the conductive film 10 and the adhesive resin film 13 are melted and jointed together and also the sealing resin film 9 flows down by its own weight to reach the surface of the mother board 11. Accordingly, the pin-like external terminals 7 of the semiconductor circuit device 1 and the terminals 12 of the mother board 11 are electrically and mechanically connected.

Then, if the heating temperature is lowered gradually up to the room temperature, the conductive film 10 and the adhesive resin film 13 are hardened at a point of time when the temperature becomes lower than the melting point in the course of the falling of the temperature, and then the sealing resin film 9 is hardened at the temperature lower than the glass transition temperature.

Therefore, the step of fitting the semiconductor circuit device 1 onto the mother board 11 is completed.

According to the first embodiment, the sealing resin film 9 has the sufficient mechanical strength after it is cooled. As a result, even if the stresses of the semiconductor circuit device 1 and the mother board 11, that are caused by the temperature change of the outside air, etc., are concentrated to the pin-like external terminals 7 in the situation that the semiconductor circuit device 1 is fitted to the mother board 11, the pin-like external terminals 7 covered with the sealing resin film 9 is hard to deform. In addition, since the pin-like external terminals 7 are isolated from the outside air by the sealing resin film 9, the reaction of the pin-like external terminals 7 with the gas existing in the outside air can be prevented.

In contrast to this, according to the structure in which the pin-like external terminals 7 are not covered with the above sealing resin film in the prior art, it is largely possible that the pin-like external terminals 7 are deformed when the stresses of the semiconductor circuit device 1 and the mother board 11 are concentrated to the pin-like external terminals 7.

Meanwhile, a structure shown in FIGS. 5A and 5B, FIG. 6, and FIG. 7 may be employed as the insulating layer structure for covering the relocated wiring patterns 6.

Figure 5A:
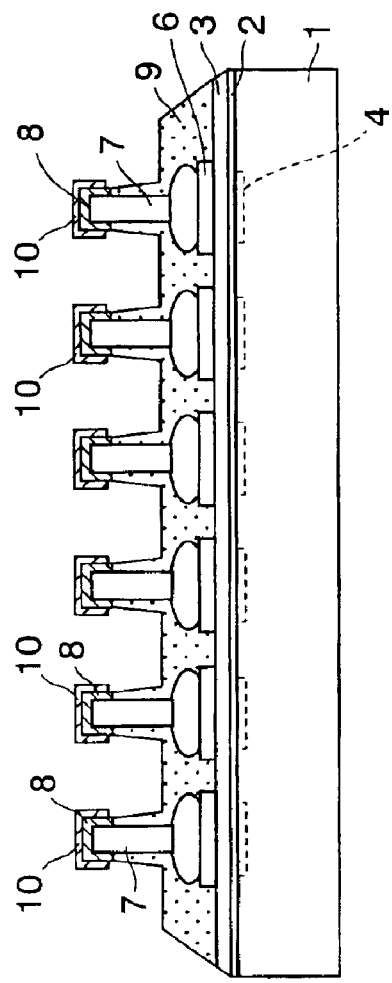
FIG. 5A, FIG. 6, and FIG. 7 are sectional views showing another example of the semiconductor device according to the first embodiment of the present invention.
Figure 5B:
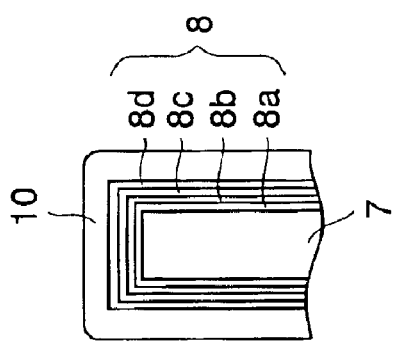
FIG. 5B is a sectional view showing a layer structure formed at top ends of pin-like external terminals shown in FIG. 5A.

The semiconductor circuit device 1 shown in FIG. 5A has the structure that top ends of the pin-like external terminals 7 projected from the sealing resin film 9 are covered with an underlying metal layer 8 and then the conductive film 10 such as the solder or the conductive paste is formed thereon. The underlying metal layer 8 is formed to improve the adhesiveness between the conductive film 10 and the pin-like external terminals 7. For example, as shown in FIG. 5B, the underlying metal layer 8 has a multi-layered structure consisting of a nickel-phosphorus (NiP) layer 8a, a phosphorus-rich NiP layer 8b, a NiSn layer 8c, and a tin-rich Sn alloy layer 8d.

For example, the underlying metal layer 8 is formed by forming a multi-layered metal layer (not shown), that consists of a nickel-phosphorus (NiP) layer, a palladium (Pd) layer, and a gold (Au) layer, on the top ends of the pin-like external terminals 7 by virtue of the electroless plating method and then causing elements in the multi-layered metal layer to move by virtue of the subsequent heating for the tin-lead (SnPb) solder jointing.

Figure 6:
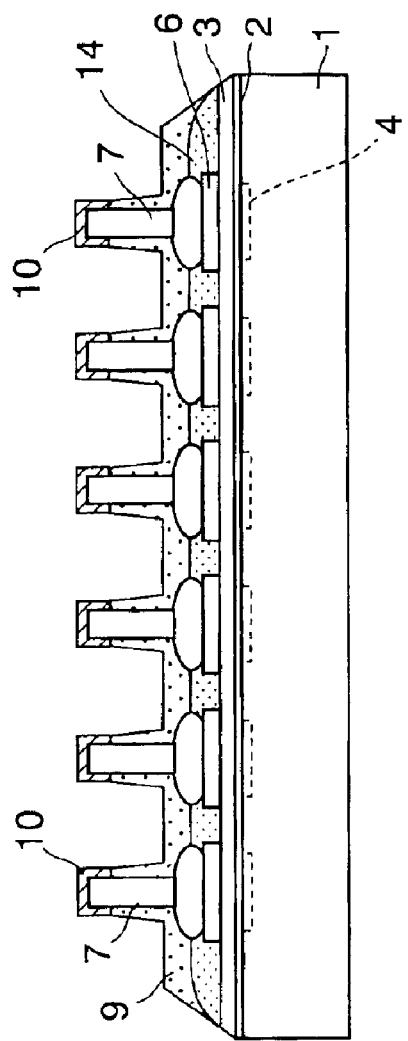
Figure 7:
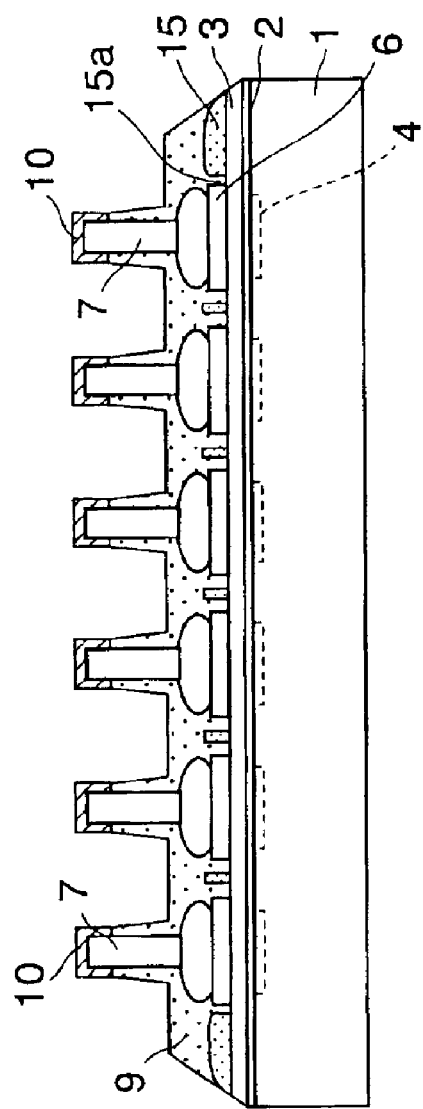

The semiconductor circuit device 1 shown in FIG. 6 and FIG. 7 has such a structure that wiring protection films 14, 15 are formed between the sealing resin film 9 and the underlying cover film 3.

The wiring protection film 14 shown in FIG. 6 has the structure that is formed after the pin-like external terminals 7 are connected to the relocated wiring patterns 6. The wiring protection film 14 is the film that is formed of non-thermoplastic insulating material, e.g., organic material such as polyimide, benzocyclobutene, etc. The wiring protection film 14 is formed to cover the relocated wiring patterns 6 and the underlying cover film 3 except the jointed portions of the pin-like external terminals 7 and the relocated wiring patterns 6.

In contrast, the wiring protection film 15 shown in FIG. 7 is the film that is formed of non-thermoplastic material, e.g., organic material such as polyimide, benzocyclobutene, etc. The wiring protection film 15 has the structure that such film 15 is formed on the relocated wiring patterns 6 and the underlying cover film 3 and then opening 15a are formed on connecting portions between the pin-like external terminals 7 and the relocated wiring patterns 6. Then, the pin-like external terminals 7 are connected to the relocated wiring patterns 6 via the opening 15a.

These wiring protection films 14, 15 are the insulating film that is hard to flow at the melting point of the conductive film 10. Therefore, as shown in FIG. 3D, even if the sealing resin film 9 flows out by the heating and is thinned on the relocated wiring patterns 6, these wiring protection films 14, 15 can sufficiently cover the relocated wiring patterns 6.

The external terminals 7 of all semiconductor circuit devices 1 shown in FIGS. 5A, 5B, 6 and 7 are connected to another electronic device in compliance with the steps in FIGS. 3A to 3D while being protected by the sealing resin film 9.

By the way, as the method of jointing the pin-like external terminals 7 to the terminals of other electronic device more simply, for example, the conductive film 10 is not formed on the top ends of the pin-like external terminals 7, but varnish resin is coated on the top ends of the pin-like external terminals 7 immediately before the packaging and then the packaging/jointing is carried out by the heating, whereby the sealing resin film 9 can flow to cover the jointed portions. In this case, the resin material having a flux action, e.g., Fluxfill (cnb837-44) manufactured by Dexter, or the like can be widely used as the sealing resin film 9.

(Second Embodiment)

In FIG. 5A of the first embodiment, the underlying metal layer 8 is formed only on the top ends of the pin-like external terminals 7 of the semiconductor circuit device 1. In this case, the overall pin-like external terminals 7 on the relocated wiring patterns 6 may be covered with the metal layer.

Figure 8A:
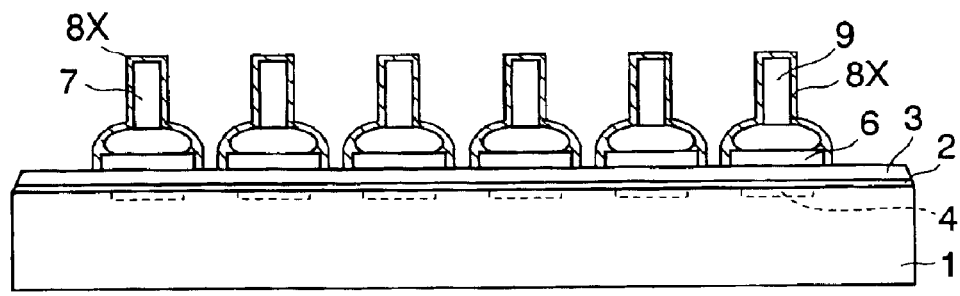
FIGS. 8A to 8C are sectional views showing sealing steps of a semiconductor device according to a second embodiment of the present invention.

First, as shown in FIG. 2A, the pin-like external terminals 7 are jointed onto the relocated wiring patterns 6. Then, as shown in FIG. 8A, an underlying metal layer 8X is formed on exposed surfaces of the pin-like external terminals 7 and exposed surfaces of the relocated wiring patterns 6 by the electroless plating method. The underlying metal layer 8X has the multi-layered structure in which the nickel-phosphorus (NiP) layer, the palladium (Pd) layer, and the gold (Au) layer are formed in sequence by the electroless plating method, for example.

Figure 8B:
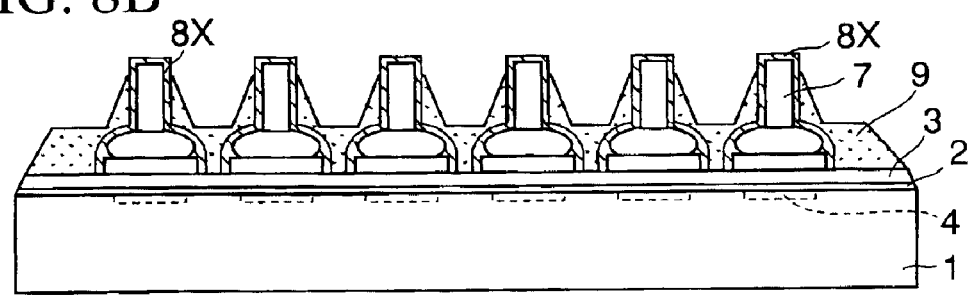

Then, as shown in FIG. 8B, the sealing resin film 9 is formed on the underlying cover film 3. The sealing resin film 9 buries the surface other than the top end portions of the pin-like external terminals 7. Also, the sealing resin film 9 is formed of the material that is same as that shown in the first embodiment and flows at the temperature in excess of the glass transition temperature.

Figure 8C:
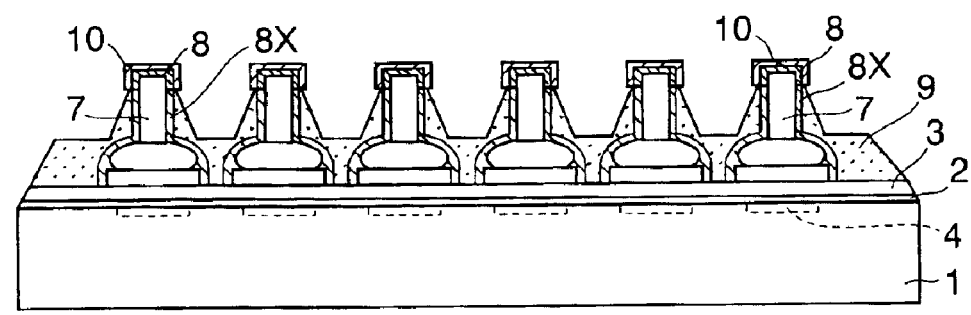

Then, as shown in FIG. 8C, if the solder is jointed to the underlying metal layer 8X exposed from the sealing resin film 9 by the heating, the layer structure is changed at the top ends of the pin-like external terminals 7 by the heat to provide another underlying metal layer 8. The layer structure of the underlying metal layer 8 is changed into the multi-layered structure that consists of the NiP layer, the phosphorus-rich NiP layer, the NiSn layer, and the tin-rich Sn alloy layer sequentially from the surface of the pin-like external terminal 7, as shown in FIG. 5B.

Then, the pin-like external terminals 7 of the semiconductor circuit device 1 are connected to other electronic device, e.g., the terminal 12 of the mother board 11, via the conductive film 10 and the underlying metal layer 8 in compliance with the steps in FIGS. 3A to 3D.

In the semiconductor circuit device 1 having the above configuration, the underlying metal layer 8X formed as the former structure of the underlying metal layer 8, which is formed to prevent the joint degradation between the conductive film 10 and the pin-like external terminals 7, is formed to cover the areas from the top ends of the pin-like external terminals 7 to the relocated wiring patterns 6 positioned at the bottom end. Accordingly, in the jointed portions between the pin-like external terminals 7 and the relocated wiring patterns 6, the degradation due to the contamination from the outside can be prevented in the situation before the jointed portions are covered with the sealing resin film 9.

Also, since the pin-like external terminals 7 are covered with both the underlying metal layer 8, 8X and the sealing resin film 9 except the jointed portions, the deformation of the pin-like external terminals 7 due to the external stress is difficult to occur rather than the first embodiment. In addition, since the underlying metal layer 8X, the layer structure of which is not changed, is shielded from the outside air by the sealing resin film 9, the reaction of the underlying metal layer 8X with the surrounding gas can be prevented.

(Third Embodiment)

The top ends of the pin-like external terminals 7 shown in the first and second embodiments are exposed by adjusting the coating of the sealing resin film 9. But the method of exposing the pin-like external terminals 7 is not limited to this. Other examples of the method of exposing the pin-like external terminals 7 will be explained in the following.

In the third embodiment, as shown in FIG. 9A, the semiconductor circuit device employing the structure in which the pin-like external terminals 7 are directly connected to the conductive pads 4 is prepared in place of the structure in which the pin-like external terminals 7 and the conductive pads 4 are electrically connected via the relocated wiring patterns 6. In addition, the sealing resin film 9 is coated on the underlying cover film 3 to cover perfectly the pin-like external terminals 7, and then the sealing resin film 9 is semi-hardened.

Figure 9C:
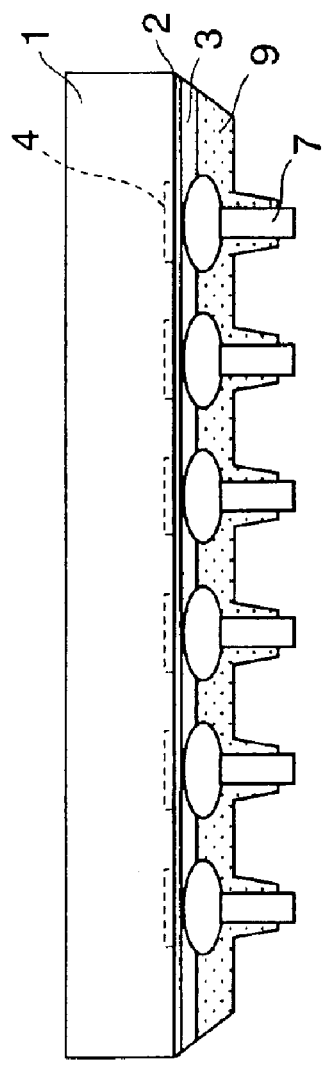

Then, as shown in FIG. 9B, the sealing resin film 9 on the top ends of the pin-like external terminals 7 is dipped into an organic solvent 16 in a vessel 17 and removed. Accordingly, as shown in FIG. 9C, the top ends of the pin-like external terminals are exposed. The organic solvent 16 is a main solvent of the resin material constituting the sealing resin film 9.

Then, the remaining sealing resin film 9 is hardened and then the sealing resin film 9 and the top ends of the pin-like external terminals 7 are cleaned.

Figure 9D:
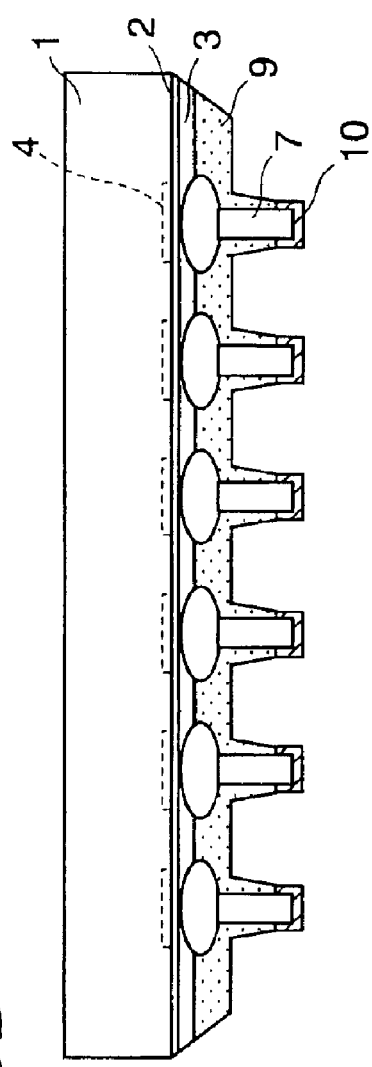

Then, as shown in FIG. 9D, the conductive film 10 such as the solder or the conductive paste is formed on the top ends of the pin-like external terminals 7.

With the above, the step of forming the conductive film 10 the top end surfaces of the pin-like external terminals 7 while exposing only the top ends of the pin-like external terminals 7 from the sealing resin film 9 is completed. Then, the top ends of the pin-like external terminals 7 are connected to other electronic device in compliance with the steps shown in FIGS. 3A to 3D.

Meanwhile, as the method of exposing the top ends of the pin-like external terminals 7 from the sealing resin film 9, following steps may be employed.

First, the structure shown in FIG. 9A is formed. Then, as shown in FIG. 10A, the sealing resin film 9 on the top ends of the pin-like external terminals 7 is exposed to a plasma 18 such as $O_2$, $CF_4$, an oxygen-containing gas, or the like and is removed. In this case, since an insulating or metallic plate 19, which has openings 19a to supply the plasma 18 to the top ends of the pin-like external terminals 7, is interposed between the semiconductor circuit device 1 and the plasma 18, the sealing resin film 9 is shielded from the plasma except the top ends of the pin-like external terminals 7.

As a result, as shown in FIG. 10B, only the sealing resin film 9 formed on the top end surfaces of the pin-like external terminals 7 is removed so as to expose the top ends of the pin-like external terminals 7 selectively. Then, the conductive film 10 is formed on the top ends of the pin-like external terminals 7, like FIG. 9D.

In addition, the pin-like external terminals 7 are connected to other electronic device via the conductive film 10 in accordance with the steps shown in FIGS. 3A to 3D.

(Fourth Embodiment)

In a fourth embodiment, the jointing between the semiconductor circuit device having the BGA-type exterminal terminal structure and other electronic device will be explained hereunder.

Figure 11A:
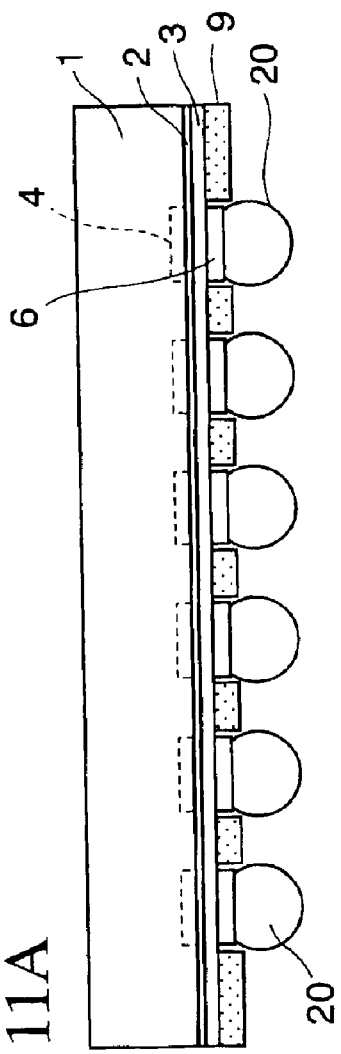

First, in the semiconductor circuit device 1 shown in FIG. 11A, solder balls as ball-like external terminals 20 are jointed onto the relocated wiring patterns 6 as shown in FIG. 4. Also, the relocated wiring patterns 6 are covered with the sealing resin film 9, which is formed on the underlying cover film 3, except the jointed portions to the ball-like external terminals 20. As the material of the sealing resin film 9, the same material as that set forth in the first embodiment is employed.

Figure 11B:
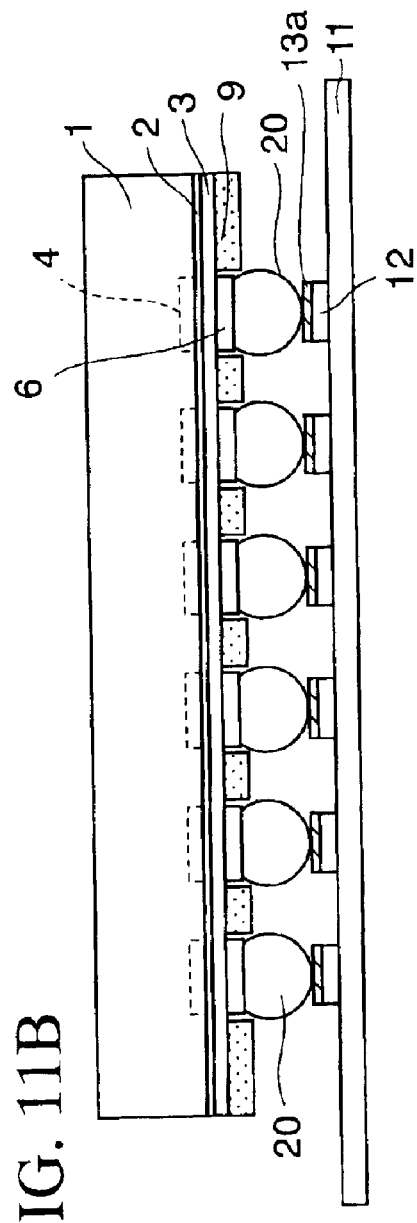
Figure 12:
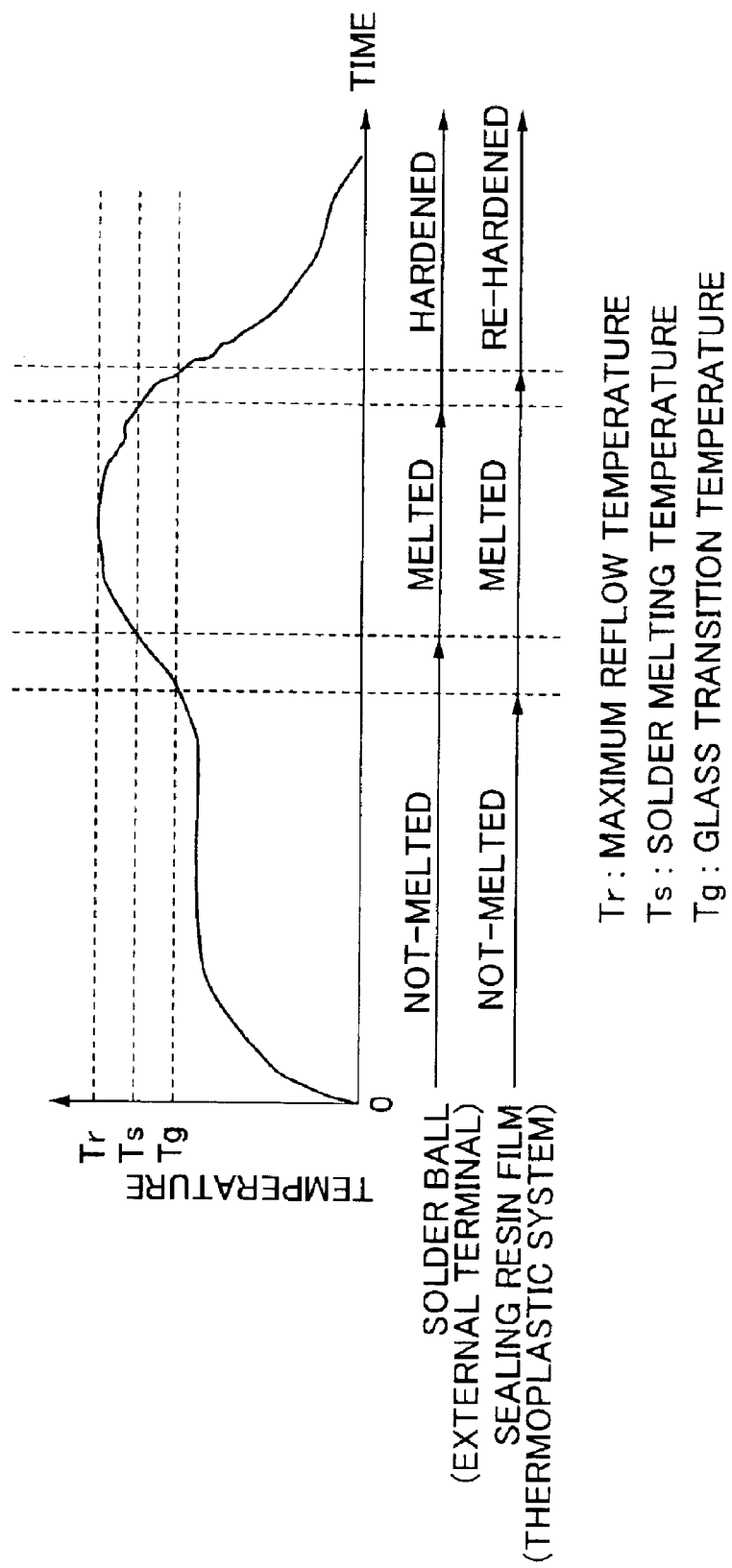
FIG. 12 is a view showing a temperature profile and states of the resin when the semiconductor device according to the fourth embodiment of the present invention is connected to the mother board.

Then, as shown in FIG. 11B, the ball-like external terminals 20 of the semiconductor circuit device 1 are put on the terminals 12 of the mother board 11 as the electronic device explained in the first embodiment via an adhesive conductive resin 13a. Then, the semiconductor circuit device 1 and the mother board 11 are placed in the heating atmosphere, and then are heated in compliance with the temperature profile shown in FIG. 12.

First, the heating temperature of the mother board 11 and the semiconductor circuit device 1 is gradually increased up to the melting point of the ball-like external terminals 20 to pass through the glass transition temperature Tg as the passing point. Accordingly, as shown in FIG. 11C, the sealing resin film 9 has the flowability and then flows out gradually onto the surfaces of the ball-like external terminals 20.

Then, the heating temperature is increased higher than the melting point of the ball-like external terminals 20. Thus, as shown in FIG. 11D, both the ball-like external terminals 20 and the adhesive conductive resin 13a are melted and jointed to each other, and also the sealing resin film 9 further flows out due to its own weight to come up to the surface of the mother board 11. Accordingly, the ball-like external terminals 20 of the semiconductor circuit device 1 are connected to the terminals 12 of the mother board 11.

After this, if the heating temperature is gradually lowered up to the room temperature, the ball-like external terminals 20 are hardened at a point of time when the temperature becomes lower than the melting point in the course of the falling of the temperature, and then the sealing resin film 9 is hardened at the temperature lower than the glass transition temperature.

As a result, the fitting of the semiconductor circuit device 1 onto the mother board 11 is ended.

In such semiconductor circuit device 1 having the BGA-type package, in the heating step of connecting the solder balls as the ball-like external terminals 20 to the terminals 12 of the mother board 11, the sealing resin film 9 that covers the underlying cover film 3 and the relocated wiring patterns 6 around the external terminals 20 flows out due to its own weight so as to cover the ball-like external terminals 20 and the terminals 12.

For this reason, the jointed portions, the ball-like external terminals 20, and the terminals 12 are covered with the sealing resin film 9 after the ball-like external terminals 20 and the terminals 12 are jointed mutually. Therefore, the reaction of the jointed portions, the ball-like external terminals 20, and the terminals 12 with the gas contained in the outside air can be suppressed. In addition, the process of covering the ball-like external terminals 20, etc. with the sealing resin film 9 is not executed independently but executed simultaneously with the jointing between the ball-like external terminals 20 and the terminals 12. Therefore, the reduction in the throughput can be prevented.

In addition, the jointed portions between the semiconductor circuit device 1 and the mother board 11 are substantially increased in thickness by the sealing resin film 9 and thus such jointed portions can withstand the stress concentration applied from the outside, so that the generation of the cohesion destruction can be prevented.

When the defect occurring rate is examined by the temperature cycle test respectively in the structure in which the jointed portions are covered with the sealing resin film 9 and the structure in which the jointed portions are exposed like the prior art, results shown in FIG. 13 are obtained. In other words, in FIG. 13, since the structure in which the sealing resin is formed on the semiconductor device not to cover the jointed portions of the external terminals to other electronic device is employed, the strain is generated in the jointed portions, and thus the destruction is ready to occur if the time exceeds a certain lifetime. In contrast, according to the fourth embodiment, it can be understood that the defect occurring rate is improved rather than the structure in the prior art.

(Fifth Embodiment)

In a fifth embodiment, the jointing between the semiconductor circuit device having the LGA-type external terminal structure and other electronic device will be explained hereunder.

The semiconductor circuit device 1 shown in FIG. 14A is prepared. The semiconductor circuit device 1 has the relocated wiring patterns 6 shown in FIG. 4. The relocated wiring patterns 6 are covered with the sealing resin film 9 formed on the underlying cover film 3 other than the connected portions to other electronic device as the external terminals 6a. As the material of the sealing resin film 9, the same material as set forth in the first embodiment is employed. In this case, the exposure of the external terminals 6a is carried out by supplying partially the plasma or irradiating the laser beam, as shown in FIGS. 10A and 10B, for example.

Then, as shown in FIG. 14B, the external terminals 6a of the semiconductor circuit device 1 are put on the terminals 12 of the mother board 11 to sandwich an adhesive conductive resin layer 21 between them. Then, the semiconductor circuit device 1 and the mother board 11 are placed in the heating atmosphere and then heated in compliance with the temperature profile shown in FIG. 12.

Figure 14C:
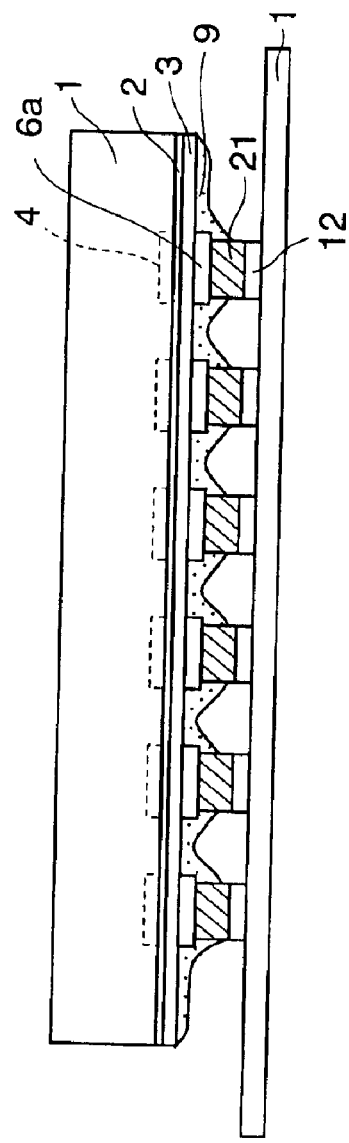

First, the heating temperature of the mother board 11 and the semiconductor circuit device 1 is gradually increased up to the melting point of the adhesive conductive resin layer 21 to pass through the glass transition temperature Tg as the passing point. Accordingly, as shown in FIG. 14C, the sealing resin film 9 has the flowability and then flows out gradually onto the surfaces of the adhesive conductive resin layer 21.

Figure 14D:
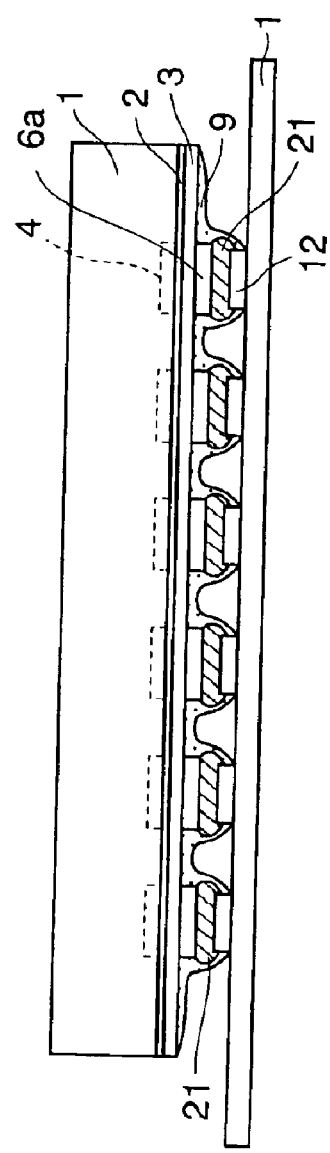

Then, the heating temperature is increased to exceed the melting point of the adhesive conductive resin layer 21. Thus, as shown in FIG. 14D, both the adhesive conductive resin layer 21 and the adhesive conductive resin 13a are melted and jointed to each other, and also the sealing resin film 9 further flows out due to its own weight to come up to the surface of the mother board 11. Accordingly, the external terminals 6a of the semiconductor circuit device 1 are connected to the terminals 12 of the mother board 11 via the adhesive conductive resin layer 21.

After this, if the heating temperature is gradually lowered up to the room temperature, the adhesive conductive resin layer 21 is hardened at a point of time when the temperature becomes lower than the melting point in the course of the falling of the temperature, and then the sealing resin film 9 is hardened at the temperature lower than the glass transition temperature.

As a result, the fitting of the semiconductor circuit device 1 onto the mother board 11 is completed.

As described above, in the semiconductor circuit device 1 having the LGA-type package, in the heating step of connecting the adhesive conductive resin layer 21 to the terminals 12 of the mother board 11 and the external terminals 6a of the semiconductor circuit device 1, the sealing resin film 9 located around the connected portions flows out due to its own weight so as to cover the external terminals 6a, the terminals 12 and their connected portions.

Therefore, the terminals 6a, 12 and the jointed portions are covered with the sealing resin film 9 after two terminals 6a, 20 are jointed mutually. Therefore, the reaction of the terminals 6a, 12 and the jointed portions with the gas contained in the outside air can be suppressed. In addition, the process of covering the terminals 6a, 12 with the sealing resin film 9 is executed simultaneously with the jointing between the terminals 6a and the terminals 12. Therefore, the reduction in the throughput can be prevented.

In addition, the jointed portions between the terminals 6a, 12 is covered with the sealing resin film 9 and can withstand the stress concentration applied from the outside.

(Other Embodiment)

In the above embodiments, the semiconductor devices are explained as examples of the electronic device. In this case, in the case that the electronic devices such as the printed board, the mother board, and others are connected via the external terminals, the present invention can be applied similarly.

As described above, according to the present invention, the sealing insulating film that is melted at the first heating temperature and has the flowability is formed around the external terminals, and then the external terminals are connected to other electronic device at the second heating temperature that is higher than the first heating temperature. Therefore, when the external terminals are connected to other electronic device, the sealing insulating film (resin film) flows out due to its own weight and covers the external terminals.

Also, after the connection of the external terminals is finished and the electronic device is cooled, the sealing insulating film is hardened and thus the mechanical strength of the external terminals can be reinforced by the sealing insulating film. Therefore, the sealing insulating film can relax the stress being applied from the outside to the external terminals to prevent the deformation, and also can prevent the reaction with the outer gas.

What is claimed is:

1. An electronic device comprising:
    a sealing insulating film formed on a substrate, the sealing insulating film having flowability at a first temperature;
    external terminals formed on the substrate, the external terminals being partially surrounded by the sealing insulating film; and
    a substance connected to a portion of the external terminals not surrounded by the sealing insulating film, the substance having a melting point at a second temperature higher than the first temperature,
    wherein the external terminal contacts an other electronic device via the substance.

2. An electronic device according to claim 1, wherein the substrate is a semiconductor substrate on which semiconductor elements are formed.

3. An electronic device according to claim 1, wherein the sealing insulating film is formed of resin material that is thermoplastic and has the flowability at a temperature in excess of a glass transition temperature and is solidified after the resin material is cooled below the glass transition temperature, and the substance connecting the external terminals and the other electronic device is a conductive adhesive having a melting point which is higher than the glass transition temperature.

4. An electronic device according to claim 1, wherein exposed portions of the external terminals from the sealing insulating film are formed like a pin, a ball, or a flat surface.

5. An electronic device according to claim 1, wherein the substance connecting the external terminals to the other electronic device is a conductive adhesive film having a melting point of the second temperature.

6. An electronic device according to claim 5, wherein the conductive adhesive film is solder, solder paste, or conductive resin.

7. An electronic device according to claim 6, wherein a melting temperature of the sealing insulating film is lower than a melting point of the solder.

8. An electronic device according to claim 5, wherein an underlying metal film is formed between the external terminals and the conductive adhesive film.

9. An electronic device according to claim 8, wherein the underlying metal film is also formed on surfaces of the external terminals, which are not covered with the conductive adhesive film.

10. An electronic device according to claim 1, wherein the external terminals are connected to conductive pads formed on the substrate.

11. An electronic device according to claim 1, wherein wiring patterns to which the external terminals are connected are formed on the substrate, and peripheral areas of connected portions between the wiring patterns and the external terminals are covered with the sealing insulating film.

12. An electronic device according to claim 11, wherein a non-thermoplastic insulating film is formed between the sealing insulating film and the wiring patterns.

13. An electronic device according to any one of claim 1 to claim 12, wherein the second heating temperature is higher than the first heating temperature.

14. An electronic device according to claim 1, wherein a non-thermoplastic insulating film is formed between the sealing insulating film and the substrate.

15. An electronic device comprising:
    a sealing insulating film formed on a substrate, and having a melting point at a first temperature;
    external terminals formed on the substrate, and being partially coated by the sealing insulating film; and
    wherein the external terminals have a melting point at a second temperature higher than the first temperature, and contact an other electronic device.

* * * * *